(12) United States Patent
Noy et al.

(10) Patent No.: US 8,290,239 B2
(45) Date of Patent: *Oct. 16, 2012

(54) AUTOMATIC REPAIR OF ELECTRIC CIRCUITS

(75) Inventors: Amir Noy, Kfar Mordehai (IL); Gilad Davara, Rehovot (IL)

(73) Assignee: Orbotech Ltd., Yavne (IL)

( * ) Notice: Subject to any disclaimer, the term of this patent is extended or adjusted under 35 U.S.C. 154(b) by 907 days.

This patent is subject to a terminal disclaimer.

(21) Appl. No.: 11/254,756

(22) Filed: Oct. 21, 2005

(65) Prior Publication Data

US 2007/0092128 A1  Apr. 26, 2007

(51) Int. Cl.
*G06K 9/00* (2006.01)

(52) U.S. Cl. ........ 382/141; 382/144; 382/145; 382/146; 382/147; 382/149; 382/150; 382/151; 445/61

(58) Field of Classification Search .................. 382/141, 382/144–147, 149–151; 445/61
See application file for complete search history.

(56) References Cited

U.S. PATENT DOCUMENTS

| | | | |
|---|---|---|---|
| 3,866,398 A | 2/1975 | Vernon et al. | |
| 4,148,065 A | 4/1979 | Nakagawa et al. | |
| 4,190,759 A | 2/1980 | Hongo et al. | |
| 4,258,078 A | 3/1981 | Celler et al. | |
| 4,406,844 A | 9/1983 | Froot | |
| 4,463,073 A | 7/1984 | Miyauchi et al. | |
| 4,588,468 A | 5/1986 | McGinty et al. | |
| 4,636,403 A | 1/1987 | Fisanick et al. | |
| 4,727,234 A | 2/1988 | Oprysko et al. | |
| 4,752,668 A | 6/1988 | Rosenfield et al. | |
| 4,877,175 A | 10/1989 | Jones et al. | |
| 4,931,307 A | 6/1990 | Sugita et al. | |
| 5,010,232 A | 4/1991 | Arai et al. | |
| 5,093,279 A | 3/1992 | Andreshak et al. | |
| 5,099,101 A | 3/1992 | Millerick et al. | |
| 5,104,480 A | 4/1992 | Wojnarowski et al. | |
| 5,116,641 A | 5/1992 | Patel et al. | |
| 5,164,565 A * | 11/1992 | Addiego et al. | 219/121.68 |
| 5,171,963 A | 12/1992 | Saruta et al. | |
| 5,208,437 A | 5/1993 | Miyauchi et al. | |

(Continued)

FOREIGN PATENT DOCUMENTS

JP  58006127  1/1983

(Continued)

OTHER PUBLICATIONS

Petefish et al. "High Density Interconnection Technology for High Performance Packaging", IEPS Proceedings of the Technical Conference, Sep. 27-30, 1992, pp. 700-720. vol. 1.

(Continued)

*Primary Examiner* — Matthew Bella
*Assistant Examiner* — Julian Brooks
(74) *Attorney, Agent, or Firm* — Sughrue Mion, PLLC

(57) ABSTRACT

An apparatus and method for automatically inspecting and repairing printed circuit boards includes an inspection functionality automatically inspecting printed circuit boards and providing a machine readable indication of regions thereon requiring repair. An automatic repair functionality employs the machine readable indication to repair the printed circuit boards at some of the regions thereon requiring repair. An automatic repair reformulation functionality automatically reinspects the printed circuit boards following an initial automatic repair operation, and provides to the automatic repair functionality a reformulated machine readable indication of regions thereon requiring repair.

15 Claims, 12 Drawing Sheets

U.S. PATENT DOCUMENTS

| | | | |
|---|---|---|---|
| 5,258,077 A | | 11/1993 | Shahryar |
| 5,319,183 A | | 6/1994 | Hosoya et al. |
| 5,325,582 A | * | 7/1994 | Glaser et al. ............... 29/840 |
| 5,332,946 A | | 7/1994 | Eckersley et al. |
| 5,369,431 A | | 11/1994 | Levy et al. |
| 5,423,931 A | | 6/1995 | Inoue et al. |
| 5,444,188 A | | 8/1995 | Iwayama et al. |
| 5,459,410 A | * | 10/1995 | Henley ............... 324/770 |
| 5,466,908 A | | 11/1995 | Hosoya et al. |
| 5,470,644 A | | 11/1995 | Durant |
| 5,472,828 A | | 12/1995 | Akins et al. |
| 5,494,781 A | | 2/1996 | Ohtani et al. |
| 5,513,099 A | | 4/1996 | Schein |
| 5,535,903 A | | 7/1996 | Fujioka |
| 5,539,174 A | | 7/1996 | Rostoker et al. |
| 5,657,075 A | | 8/1997 | Roessner |
| 5,662,822 A | | 9/1997 | Tada et al. |
| 5,799,104 A | | 8/1998 | Nakamura et al. |
| 5,812,693 A | | 9/1998 | Burt et al. |
| 5,831,854 A | | 11/1998 | Yamamoto et al. |
| 5,849,149 A | | 12/1998 | Marwah et al. |
| 5,851,349 A | | 12/1998 | Marwah et al. |
| 5,961,860 A | | 10/1999 | Lu et al. |
| 6,046,429 A | | 4/2000 | Datta |
| 6,054,090 A | | 4/2000 | Duis et al. |
| 6,072,899 A | | 6/2000 | Irie et al. |
| 6,074,571 A | | 6/2000 | Smolinski |
| 6,091,996 A | | 7/2000 | Whitehead et al. |
| 6,119,335 A | | 9/2000 | Park et al. |
| 6,165,649 A | | 12/2000 | Grenon |
| 6,168,910 B1 | | 1/2001 | Hino et al. |
| 6,180,953 B1 | | 1/2001 | Smolinski |
| 6,205,239 B1 | | 3/2001 | Lin et al. |
| 6,222,156 B1 | | 4/2001 | Datta |
| 6,228,464 B1 | | 5/2001 | Miyaji |
| 6,243,188 B1 | * | 6/2001 | Stukalin et al. ............ 359/201.1 |
| 6,277,526 B1 | | 8/2001 | Yang |
| 6,291,796 B1 | | 9/2001 | Lu et al. |
| 6,322,935 B1 | | 11/2001 | Smith |
| 6,329,830 B1 | | 12/2001 | Tackett et al. |
| 6,455,331 B2 | | 9/2002 | Yu et al. |
| 6,468,356 B1 | | 10/2002 | Crema et al. |
| 6,479,120 B2 | | 11/2002 | Miyaji |
| 6,483,937 B1 | * | 11/2002 | Samuels ............... 382/144 |
| 6,546,308 B2 | | 4/2003 | Takagi et al. |
| 6,602,430 B1 | | 8/2003 | Nally et al. |
| 6,631,558 B2 | | 10/2003 | Burgess |
| 6,633,376 B1 | | 10/2003 | Nishida et al. |
| 6,657,159 B2 | | 12/2003 | McKee et al. |
| 6,713,685 B1 | | 3/2004 | Cotton |
| 6,799,130 B2 | | 9/2004 | Okabe et al. |
| 6,849,363 B2 | | 2/2005 | Ohashi et al. |
| 6,853,743 B2 | | 2/2005 | Kotani et al. |
| 6,870,611 B2 | | 3/2005 | Savereigo et al. |
| 6,873,720 B2 | | 3/2005 | Cai et al. |
| 7,127,099 B2 | | 10/2006 | Noy |
| 7,170,029 B2 | | 1/2007 | Song et al. |
| 7,355,692 B2 | * | 4/2008 | Noy et al. ............... 356/237.5 |
| 7,528,342 B2 | * | 5/2009 | Deshi ............... 219/121.68 |
| 2001/0011545 A1 | | 8/2001 | Thompson et al. |
| 2001/0028454 A1 | | 10/2001 | Savareigo |
| 2002/0001759 A1 | | 1/2002 | Ohashi et al. |
| 2002/0037643 A1 | * | 3/2002 | Ishimaru ............... 438/642 |
| 2003/0020905 A1 | * | 1/2003 | Savareigo et al. ............ 356/237.5 |
| 2003/0127441 A1 | | 7/2003 | Haight et al. |
| 2003/0139838 A1 | * | 7/2003 | Marella ............... 700/110 |
| 2003/0203591 A1 | | 10/2003 | Corbet |
| 2003/0207184 A1 | | 11/2003 | Smith |
| 2004/0019763 A1 | * | 1/2004 | Lakhani et al. ............... 711/206 |
| 2004/0120570 A1 | | 6/2004 | Levi et al. |
| 2004/0126005 A1 | | 7/2004 | Duvdevani et al. |
| 2004/0164762 A1 | | 8/2004 | Fujiwara et al. |
| 2005/0130049 A1 | | 6/2005 | Ohashi et al. |
| 2005/0195389 A1 | | 9/2005 | Noy et al. |
| 2005/0196688 A1 | | 9/2005 | Kim et al. |
| 2005/0239365 A1 | * | 10/2005 | Hiraoka ............... 445/61 |
| 2006/0113291 A1 | | 6/2006 | Hall |
| 2006/0283845 A1 | | 12/2006 | Lauer et al. |

FOREIGN PATENT DOCUMENTS

| | | |
|---|---|---|
| JP | 05273138 | 10/1993 |
| JP | 6082801 A | 3/1994 |
| JP | 08114792 | 5/1996 |
| JP | 8229920 A | 9/1996 |
| JP | 3633776 | 8/1999 |
| JP | 11284340 | 10/1999 |
| JP | 11-317579 | 11/1999 |
| JP | 11347756 | 12/1999 |
| JP | 2000098591 | 4/2000 |
| JP | 3696426 | 7/2000 |
| JP | 2000271777 | 10/2000 |
| JP | 2001356099 A | 12/2001 |
| JP | 2002-71939 | 3/2002 |
| JP | 2002232150 | 8/2002 |
| JP | 2002261425 | 9/2002 |
| JP | 2003-37350 | 2/2003 |
| JP | 3396548 | 2/2003 |
| JP | 2003-86645 | 3/2003 |
| JP | 2003-156763 | 5/2003 |
| JP | 2003-194735 | 7/2003 |
| JP | 2004-061118 | 2/2004 |
| JP | 2004-297452 A | 10/2004 |
| JP | 2006-19492 | 1/2006 |
| JP | 2006515112 A | 5/2006 |
| JP | 2007528490 T | 10/2007 |
| TW | 374288 | 9/1987 |
| TW | 388197 | 4/2000 |
| TW | 479917 | 3/2002 |
| TW | I233998 | 6/2005 |
| TW | I244359 | 11/2005 |
| TW | 262752 | 9/2006 |
| WO | WO 8607492 | 12/1986 |
| WO | 0009993 A1 | 2/2000 |
| WO | 2004059567 A2 | 7/2004 |

OTHER PUBLICATIONS

English language Translation of "Office Action," issued in connection with Japanese Patent Application No. 2006-286599, dated Jun. 27, 2011.

* cited by examiner

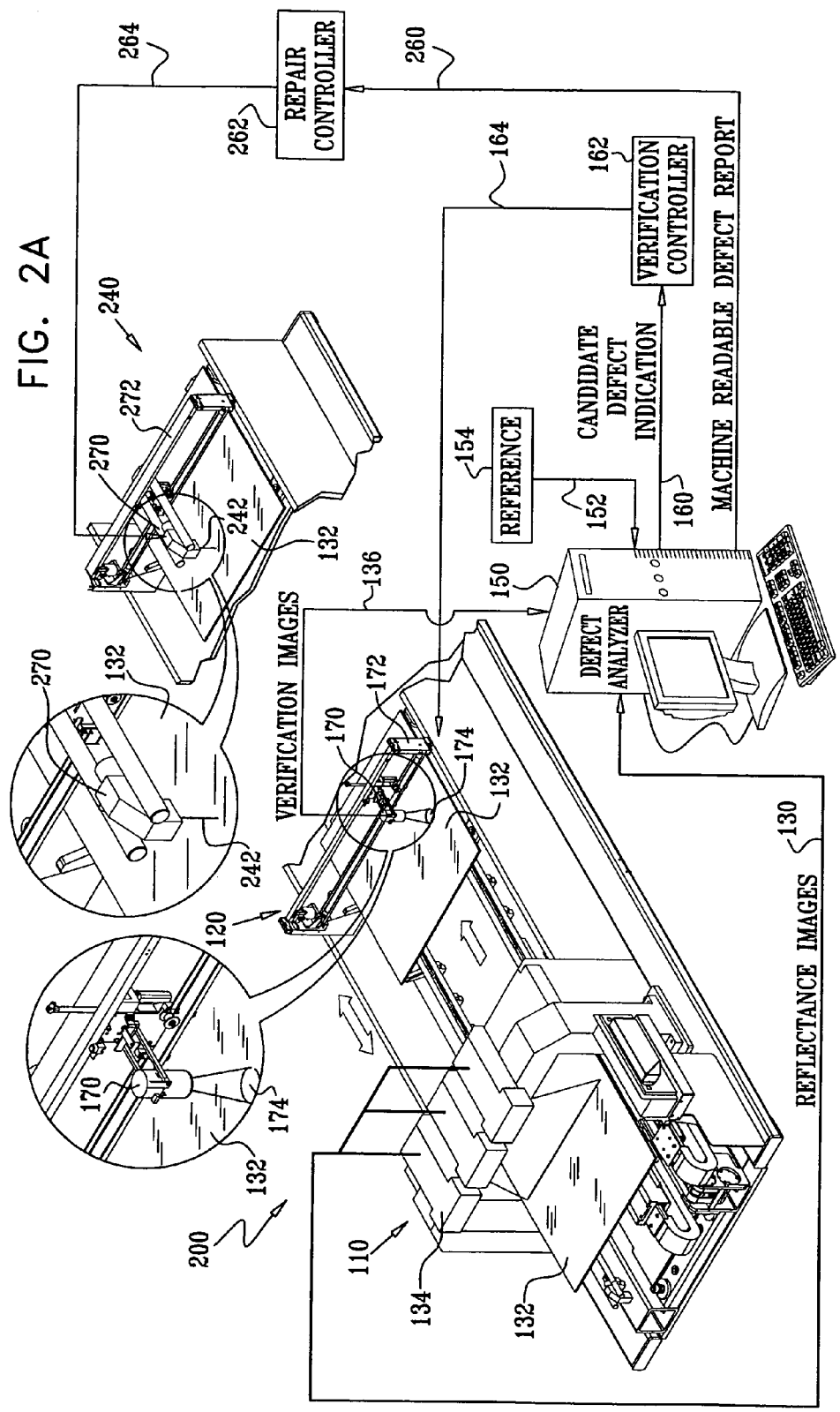

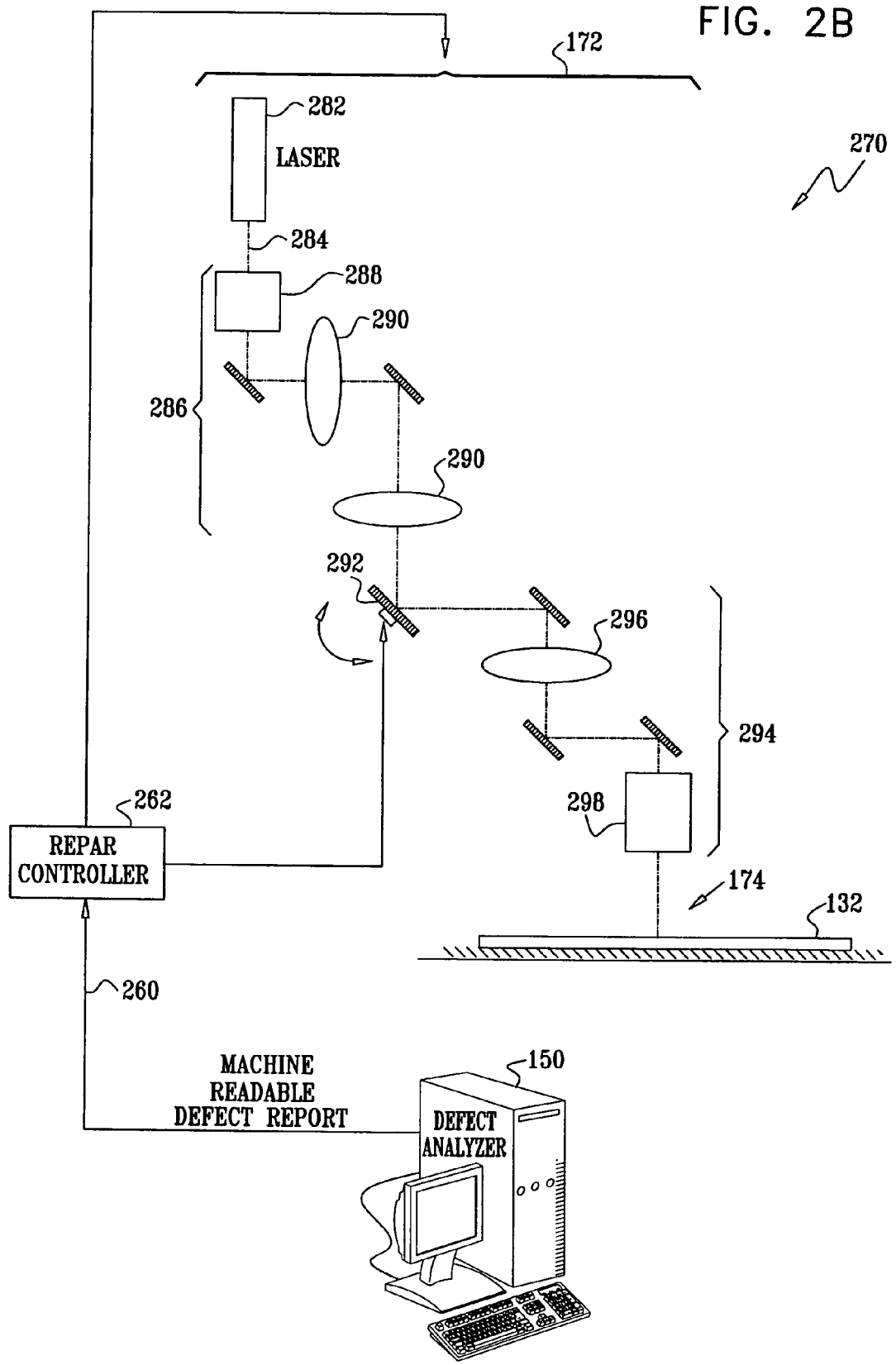

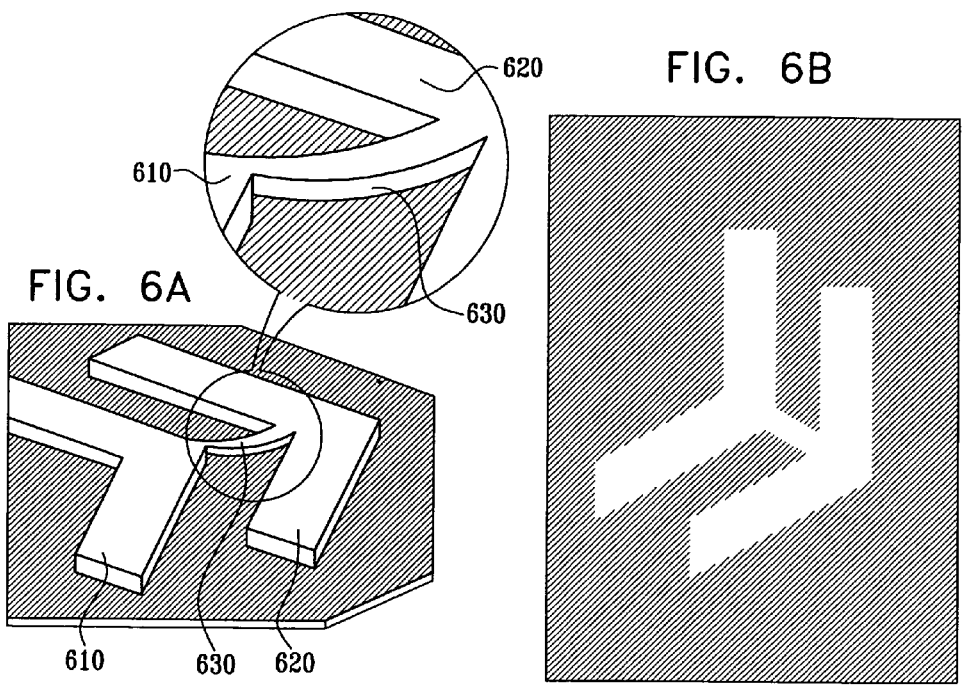
FIG. 6A
FIG. 6B
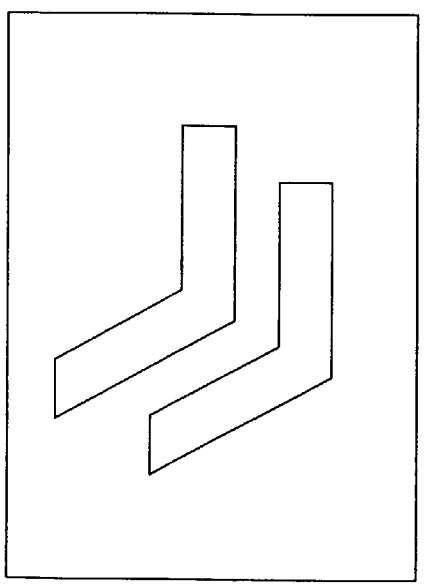
FIG. 6C
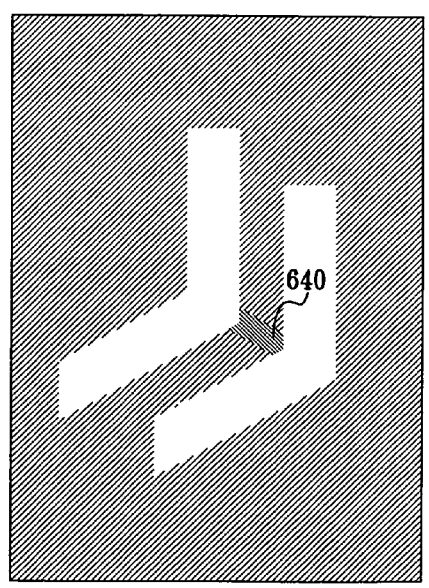
FIG. 6D

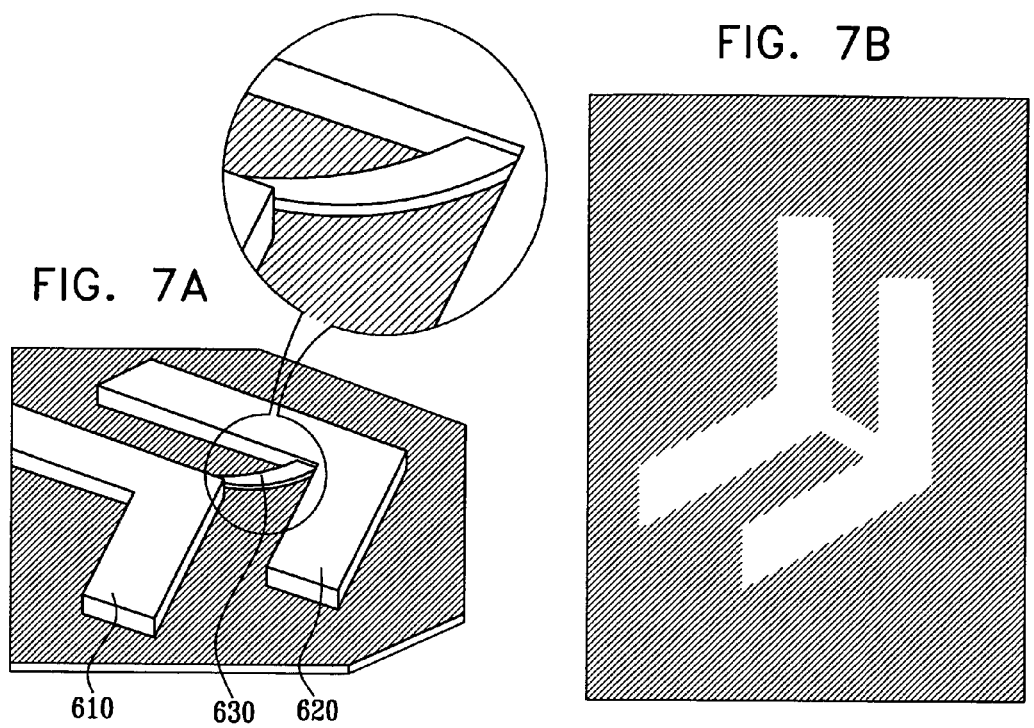
FIG. 7A
FIG. 7B
610  630  620
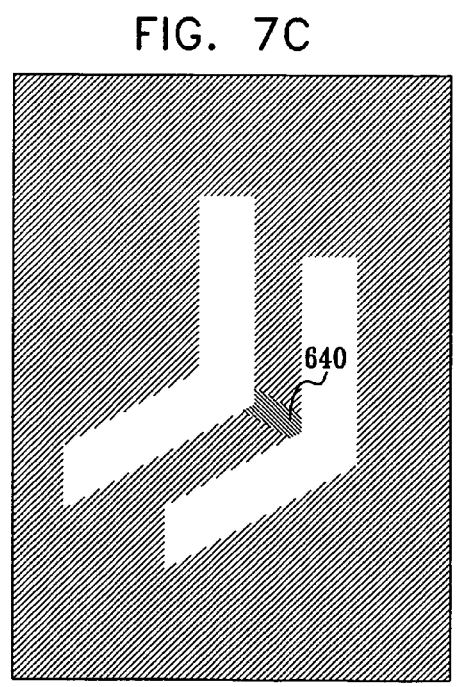
FIG. 7C
640

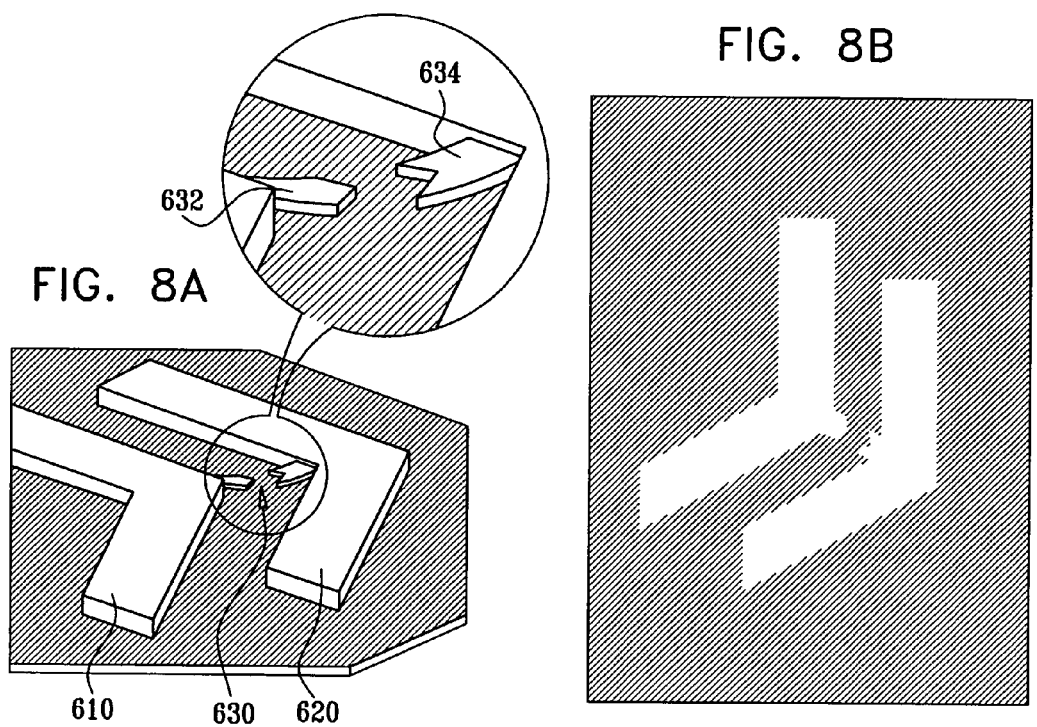
FIG. 8A
FIG. 8B
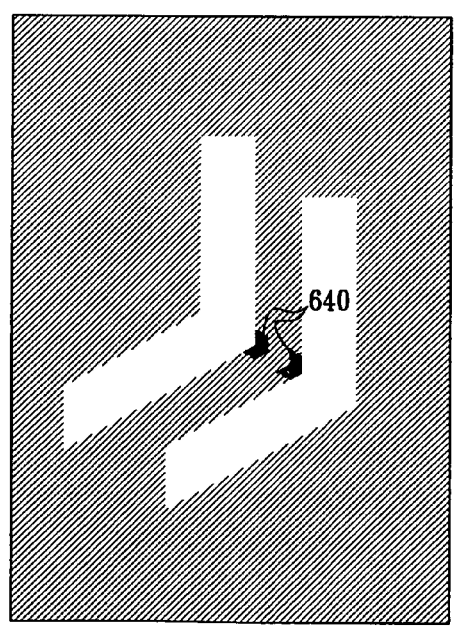
FIG. 8C

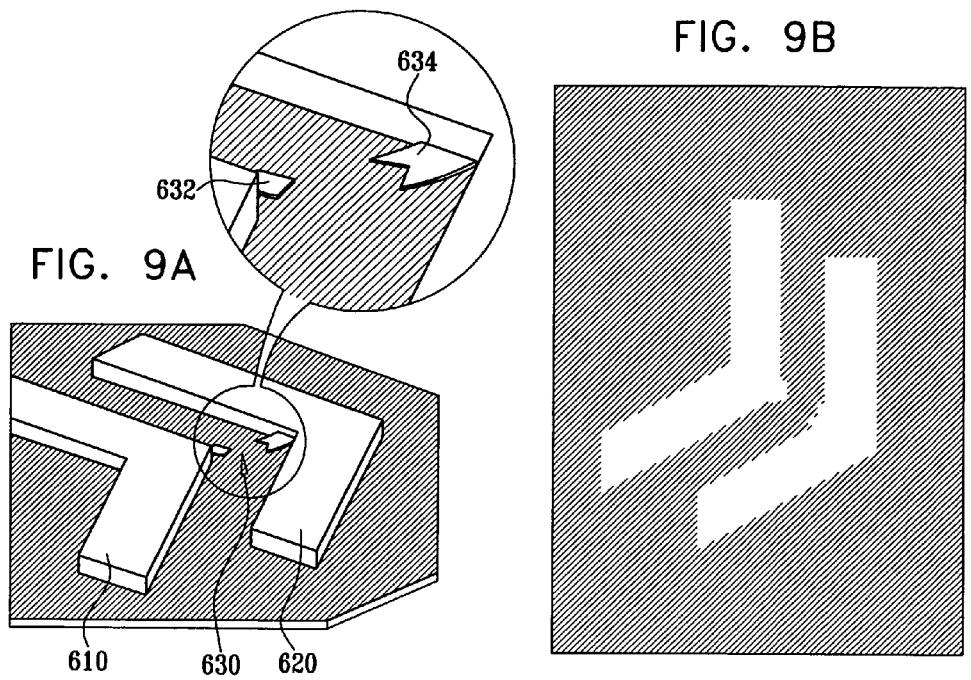
FIG. 9A
FIG. 9B
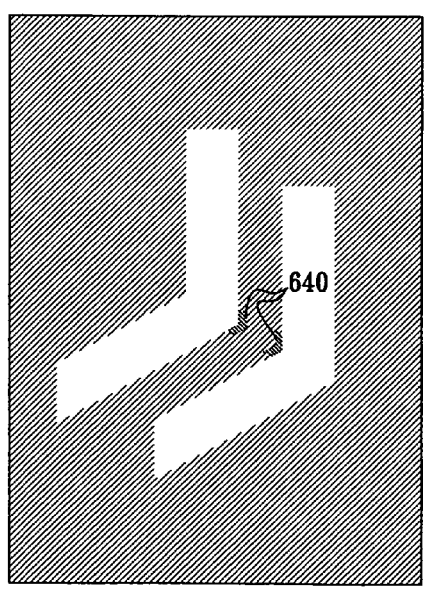
FIG. 9C

AUTOMATIC REPAIR OF ELECTRIC CIRCUITS

FIELD OF THE INVENTION

The present invention generally relates to the inspection and repair of electrical circuits during manufacture.

BACKGROUND OF THE INVENTION

Various automated defect inspection (AOI) and verification systems may be employed to detect defects in electrical circuits, such as printed circuit boards, flat panel displays, interconnect devices and the like, during manufacture. AOI systems useful for the inspection of various printed circuit boards and interconnect devices include, inter alia, the Vision™, Inspire™, Spiron™, InFinex™, and Discovery™ AOI systems commercially available from Orbotech Ltd. of Yavne, Israel. AOI systems useful for the inspection of flat panel displays include, inter alia, Invision™ and Supervision™ AOI systems also commercially available from Orbotech Ltd. of Yavne, Israel.

Defective electrical circuits either are discarded or in some cases are repaired. Conventionally, repair is carried out manually, based in part on results from automated verification and repair inspection.

SUMMARY OF THE INVENTION

The present invention seeks to provide improved systems and methodologies for the inspection and repair of electrical circuits.

There is thus provided in accordance with a preferred embodiment of the invention an apparatus and related method for automatically inspecting and repairing printed circuit boards including an inspection functionality automatically inspecting printed circuit boards and providing a machine readable indication of regions thereon requiring repair; an automatic repair functionality employing the machine readable indication to repair the printed circuit boards at at least some of the regions thereon requiring repair; and automatic repair reformulation functionality automatically reinspecting the printed circuit boards following an initial automatic repair operation, and providing to the automatic repair functionality a reformulated machine readable indication of regions thereon requiring repair.

Additional features of preferred embodiments of the invention include one or more of the following features: a sweeping laser assembly for ablating spurious conductor deposits within at least some of the regions, the sweeping laser assembly including a laser and a fast steering mirror; a laser that outputs a beam having an intensity sufficient to remove at least some of a conductor but avoids damaging a substrate portion associated with the printed circuit board; and/or at least one element that is common to each of the verification and repair functionalities. Typically the at least one element is an optical element, and the verification and repair functionalities share, in part, a common optical path.

The inspection functionality includes a candidate defect identification operation and a defect verification operation.

The automatic repair functionality inspects an initial repair operation and as necessary reformulates a machine readable indication of regions requiring repair and performs an additional repair operation in response to the reformulated machine readable indication.

There is thus provided in accordance with another preferred embodiment of the invention an apparatus and related method for automatically marking printed circuit boards including an inspection functionality automatically inspecting printed circuit boards and providing a machine readable indication of a repairability of the printed circuit boards; and an automatic marking functionality employing the machine readable indication to mark automatically mark printed circuit indicated as being not repairable.

Preferred embodiments of the invention include an automatic marking functionality having a laser ablation device that is operative to ablate a portion of a not repairable printed circuit board. The automatic marking functionality is operative to form an ablation marking visible to a human operator.

BRIEF DESCRIPTION OF THE DRAWINGS

The present invention will be understood and appreciated from the following description, taken in conjunction with the drawings in which:

FIG. 2A is a simplified pictorial illustration of apparatus for automatically inspecting and repairing electronic circuits constructed and operative in accordance an embodiment of the present invention;

FIG. 2B is a simplified schematic illustration of a portion of the apparatus of FIG. 2A;

FIGS. 6A-11 are simplified illustrations of portions of an electrical circuit repaired in accordance with the process illustrated in FIG. 5.

DETAILED DESCRIPTION OF PREFERRED EMBODIMENTS

Figure 1:
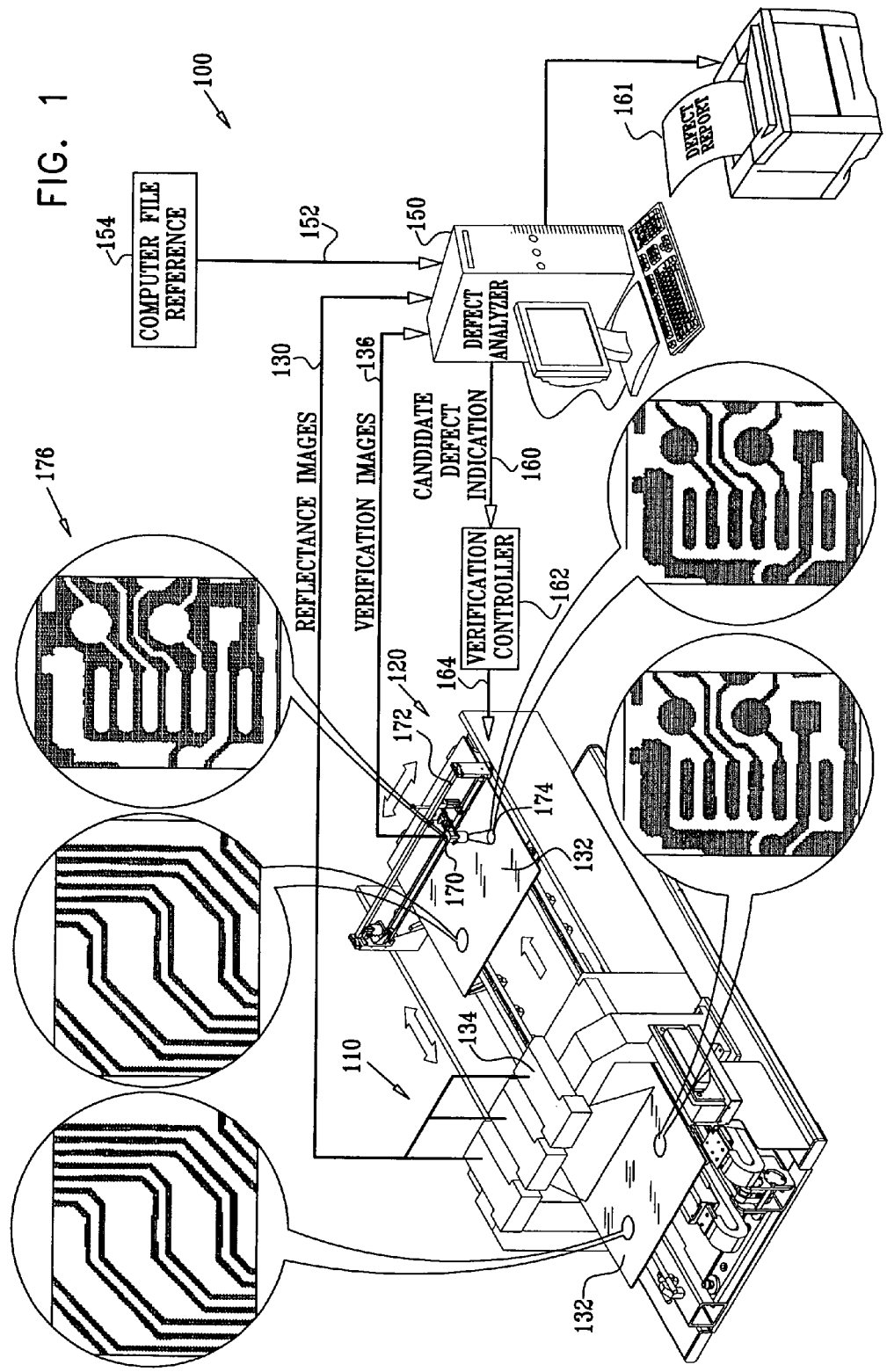
FIG. 1 is a simplified pictorial illustration of electronic circuit inspection apparatus for automatically inspecting electronic circuits constructed and operative in accordance with an embodiment of the present invention.

Reference is made to FIG. 1 which is a simplified partially schematic and partially pictorial illustration of electronic circuit inspection apparatus 100 for automatically inspecting electronic circuits constructed and operative in accordance an embodiment of the present invention. As used herein, the term "electronic circuits" is meant to include, without limitation, at least printed circuit boards, interconnect devices such as ball grid array substrates, flat panel displays and the like. As seen in FIG. 1, an electronic circuit inspection apparatus 100 may include first inspection station 110 for inspecting electronic circuits in combination with an automated defect verification station 120 for verifying the correctness of defects found by the first inspection station 110. Although first inspection station 110 and verification station 120 are shown as integrated into a single electronic circuit inspection apparatus 100, this need not be the case such that each of the first inspection station 110 and verification station 120 may be, and often are, separate stand-alone devices. For example, the Discovery™ inspection apparatus and VRS™ verification apparatus commercially available from Orbotech Ltd. of Yavne, Israel, are separate devices.

In accordance with an embodiment of the invention, first inspection station 110 acquires an image, including at least one or more reflectance images 130, of an electrical circuit to be inspected, designated by reference numeral 132. The one or more reflectance images 130 are acquired, for example, by scanning electrical circuit to be inspected 132 at image acquisition means 134. Other suitable image acquisition means, for example area image acquisition means, may also be employed. A reflectance image 130 may be, for example, an image of a complete electronic circuit 132 or a composite of a plurality of two dimensional image frames of electronic circuit 132. Different reflectance images may be acquired under the same, or different, configurations of illumination.

In accordance with an embodiment of the present invention, system 100 is adapted to initially perform automated verification of a reflectance image acquired at first inspection station 110 to identify candidate defects, and then to verify the candidate defects found in the reflectance image by further optically inspecting at least one inspection verification image, designated by reference numeral 136, acquired at verification station 120. Verification images 136 may be obtained from fluorescence inspection or height inspection of candidate defects or images obtained under different schemes of illumination, for example illumination having differing spectral content or illumination of different angular coverage. Alternatively, any other suitable type of electrical circuit inspection or testing subsystem may be employed to verify candidate defects as real defects or otherwise.

As seen in FIG. 1, the at least one reflectance image 130 is provided to a defect analyzer 150 operative to additionally receive a reference image 152 prepared, for example, from a computer file reference 154, corresponding to electrical circuit 132. Suitable computer file references may be derived from one or more of CAM (computer aided manufacturing), CAD (computer aided design) files and images acquired from printed circuit boards which are known to be not defective. In accordance with an embodiment of the invention, computer file reference 154 comprises a binary image. Optionally, computer file reference 154 comprises a map of contours, namely edges between conductor and substrate, corresponding to the electrical circuit to be inspected 132, for example generally in accordance with the teachings of present Applicant's pending U.S. application Ser. No. 10/706,440, published under publication number 2004/0126005, the disclosure of which is incorporated herein by reference in its entirety for its useful background information on this point.

Defect analyzer 150 is operative to automatically optically inspect the one or more reflectance images 130 and to output indications of candidate defects 160 on electrical circuit 132. Upon completion of optical inspection, candidate defects are verified at verification station 120.

As seen in FIG. 1, a first electrical circuit 132 is undergoing automated optical inspection at inspection station 110 while a previously inspected electrical circuit 132 is located at verification station 120. The previously inspected electrical circuit has already been automatically optically inspected at inspection station 110, and at least one candidate defect 160 thereon has been identified by defect analyzer 150. A system combining an inspection station 110 and a verification station 120 is the Spiron™ AOI system commercially available from Orbotech Ltd. Optionally, verification station 120 may be a stand alone verification station, for example a VRS-5™, also commercially available from Orbotech Ltd. of Yavne, Israel, operative downstream of a stand alone automatic optical inspection station, for example an Inspire™ or Discovery™ AOI system, also commercially available from Orbotech Ltd.

The indications of candidate defects 160, corresponding to candidate defects identified on a previously inspected electrical circuit, are received by a verification controller 162, which is in operative communication with verification station 120 and supplies suitable verification control signals 164 to verification station 120 in order to acquire suitable images of candidate defects.

Verification station 120 includes a camera 170 and a positioner 172 operative to sequentially position camera 170 in response to verification control signals 164 for sequentially viewing locations of candidate defects 174. Verification control signals 164 at least indicate the geometric location of candidate defects as identified by defect analyzer 150. Optionally, other relevant information, such as for example a type of defect, may be additionally indicated. In the embodiment seen in FIG. 1, positioner 172 is operative to independently control X-Y positioning of camera 170, although other forms of positioning may be utilized, for example rotational positioning.

At each sequentially viewed candidate defect location 174 on an inspected electrical circuit 132, the location 174 is illuminated with light operative to provide an image suitable to be utilized for additional automatic computerized defect analysis. In accordance with an embodiment of the invention, candidate defect location 174 is illuminated with light at a wavelength that causes a substrate portion thereat to fluoresce, thereby producing a fluorescence image 176 for a portion of electrical circuit 132 in the vicinity of a candidate defect. Optionally, other suitable forms of illumination may be employed for defect verification, for example polychromatic or monochromatic light provided at a different angles such as a grazing angle, light having different predetermined color compositions or an angled structured light suitable for height analysis. Verification images may be at the same resolution as reflectance image 130 employed for identifying candidate defects, or at a different resolution, for example a higher resolution.

Verification images are provided to defect analyzer 150, which in the embodiment shown is operative to provide image analysis functionality for both the one or more reflectance images acquired during initial inspection and for the one or more verification images 136, although this need not be the case. Optionally, a separate defect analyzer is employed for analysis of reflective images 130 and verification images 136 respectively. Separate defect analyzers may be, for example, different CPUs located in different computers, or different CPUs in the same computer, or virtually separated CPUs in the same computer.

Image analysis functionalities for initial inspection and for subsequent automatic verification may both utilize at least some image processing algorithms in common or they may utilize different image processing algorithms. Suitable devices and methodologies for automatically optically inspecting electrical circuits and automatically verifying candidate defects as being real defects, or otherwise, are described in detail in U.S. Pat. No. 6,870,611 to Savereigo et al. and U.S. patent application Ser. No. 10/793,224 to Noy et al., published under application number 2005/195389, both of which are assigned to the present Assignee, and the disclosures of which are incorporated herein by reference in their entirety for their illuminating background information on this point.

In accordance with an embodiment of the invention, as depicted in FIG. 1, camera 170 acquires a fluorescence image 176 of a fluorescence response at location 174. The fluorescence image 176 is acquired during a time interval separate from the time interval during which a reflectance image 130 is acquired. Thus, for example, in accordance with an embodiment of the invention, a fluorescence image 176 is acquired after an entire electrical circuit 132 is scanned and candidate defect locations are indicated.

Upon acquisition of a verification image 136, such as fluorescent image 176, of location 174, camera 170 is repositioned at a next candidate defect location, as provided by verification control signals 164. Another verification image 136 is acquired at that location. The verification images 136 are provided to defect analyzer 150, which automatically analyzes each verification image to verify whether a candidate defect is an actual defect or rather a misdetection of a non-defect, sometimes referred to as a false call.

In accordance with an embodiment of the invention, upon further analysis of each verification image 136, defect analyzer outputs a defect report 161 indicating actual defects on an electrical circuit that has been initially optically inspected at least in part using reflected light, and for which images of candidate defects have been further optically inspected to verify candidate defects as being actual defects utilizing, for example, fluorescence imaging.

Reference is made to FIG. 2A which is a simplified pictorial illustration of apparatus and a functionality for inspecting electronic circuits for defects, and for verifying and repairing the defects, in accordance with an embodiment of the present invention, and to FIG. 2B which is a simplified schematic illustration of a portion of the apparatus therein. In accordance with an embodiment of the invention, an electrical circuit inspection and repair system 200, includes a first inspection station 110 for automatically inspecting electrical circuits and an automated defect verification station 120 for verifying the correctness of defects found by the first inspection station 110. In addition, in accordance with an embodiment of the invention, electrical circuit inspection and repair system 200 additionally includes a defect repair station 240 for repairing at least some defects verified at defect verification station 120 as being actual defects.

Inspection station 110, verification station 120 and their associated components seen in FIG. 2A are configured and operative as described with reference to FIG. 1. In order to maintain clarity and avoid obscuring key teaching points of the invention, further description of the structure and functionality of these subsystems has been omitted.

In accordance with an embodiment of the invention, following identification of candidate defects, and subsequent further analysis of each candidate defect to determine which are actual defects, defect analyzer 150 outputs a machine readable defect report 260 indicating actual defects on an electrical circuit 132. An indication of an actual defect preferably is based upon geometric coincidence of a candidate defect location as determined by optically inspecting an at least one reflectance image 130 acquired for the electrical circuit, and, in accordance with an embodiment of the invention, by further inspecting one or more verification images 136 corresponding to the same location.

The defect report 260, preferably in machine readable form, is provided to a repair controller 262, which is in operative communication with defect repair station 240 via repair control signals 264. Defect repair station 240 includes a repair head 270, including for example a laser for repairing repairable defects on an electrical circuit 132. Repair operations include, for example, ablating spurious portions of conductors, removal of oxides formed on conductor portions, and/or processes to locally deposit additional conductor material. In accordance with an embodiment of the invention, these operations are performed automatically in response to the machine readable defect report 260. While repair head 270 is shown and described as including a laser suitable for ablating spurious portions of an electrical circuit or removal of oxides formed on conductors, optionally the repair head may additionally include other functionalities for more complex repairs. For example, the repair head may include a functionality for depositing a conductor portion at locations where a part of a conductor is missing or malformed, for example an inkjet device.

It is to be noted however, that not all of the defects sensed by an electronic circuit inspection apparatus 100 necessarily are automatically repairable by defect repair station 240. Some defects may require manual repair or in some instances discarding of an entire defective electrical circuit 132.

With respect to electrical circuits 132 found to include non-repairable defects, repair head 270 may be configured to deliberately destroy a part of the electrical circuit to ensure that it will clearly fail further testing so as not to become part of a finished product. Optionally, deliberate destruction may be located at a predetermined location thereby forming a visible indication of defect on the faulty electrical circuit to preclude its use in subsequent fabrication operations.

In accordance with an embodiment of the invention, the operation of electrical circuit inspection and repair system 200 is fully automated. Machine readable defect report 260 indicates at least a location on electrical circuit 132 requiring repair. A prescription for how laser 242 (produced by laser generator 282 shown in FIG. 2B and described below) is to effect a repair operation may also be indicated in the defect report 260. Optionally the machine readable defect report 260 may be further processed, for example by a computer processor associated with repair controller 262, to determine a suitable prescription for one or more repair operations to be performed at electrical circuit repair station 240.

Reference is now made to FIG. 2B, which is a simplified schematic illustration of a repair head 270, including laser generator 282 producing beam 284 (together seen in FIG. 2A at reference 242), for laser repairing conductors on an electrical circuit 132. Repair head 270 is suitable, for example, for ablating spurious portions of conductor materials, removing oxide formed on a conductor, or otherwise reshaping misshaped conductor portions, and may be used as part of a process to apply conductive material to locations whereat conductor is missing.

In accordance with an embodiment of the invention, repair head 270 includes a pulsed laser generator 282, such as a passive Q-switch micro laser available from Teem Photonics of Grenoble, France, supported by a positioner 172, operative to generate a pulsed laser beam 284. A suitable micro laser may be selected, for example, from laser heads operative to output beams at a wavelength of 532 nm, at 1064 nm, or at another suitable wavelength, depending on the application. Pulsed beam 284 is passed through first focusing optics 286 including for example a 10× objective lens 288 and 125 mm focusing lenses 290, readily available from optical suppliers such as Edmund Optics and Newport Corporation, both of the United States, operative to focus laser beam 284. Pulsed beam 284 is directed, after focusing, to impinge on a two-axis fast steering mirror (FSM) 292 available from Newport Corporation, arranged to sweep the pulsed beam 284 through desired locations on electrical circuit 132. Subsequently the pulsed laser beam 284 is passed through second focusing optics 294, including, for example, a 62.9 mm lens 296 available from Edmund optics and a 10×/0.28 objective lens 298 available from Mitutoyo. In accordance with a preferred embodiment of the invention, the lenses and other optical components are arranged as shown and are suitably coated for operation in conjunction with the selected wavelength of laser beam 284. Other suitable optical arrangements may be employed.

A repair controller 262 in operative communication with positioner 272, suitably an X-Y positioner, suitably positions laser repair device 280 respective of an actual defect location on electrical circuit 132 to be repaired. Repair controller 262 additionally provides control signals operative to manipulate steering mirror 292 to steer beam 284 to impinge on electrical circuit 132 as required to perform a laser repair operation, such as ablation of spurious conductor deposits. Optionally, laser repair device 270 is stationary, and positioner 272 is operative to suitably move electrical circuit 132 relative to the laser repair device.

Figure 3A:
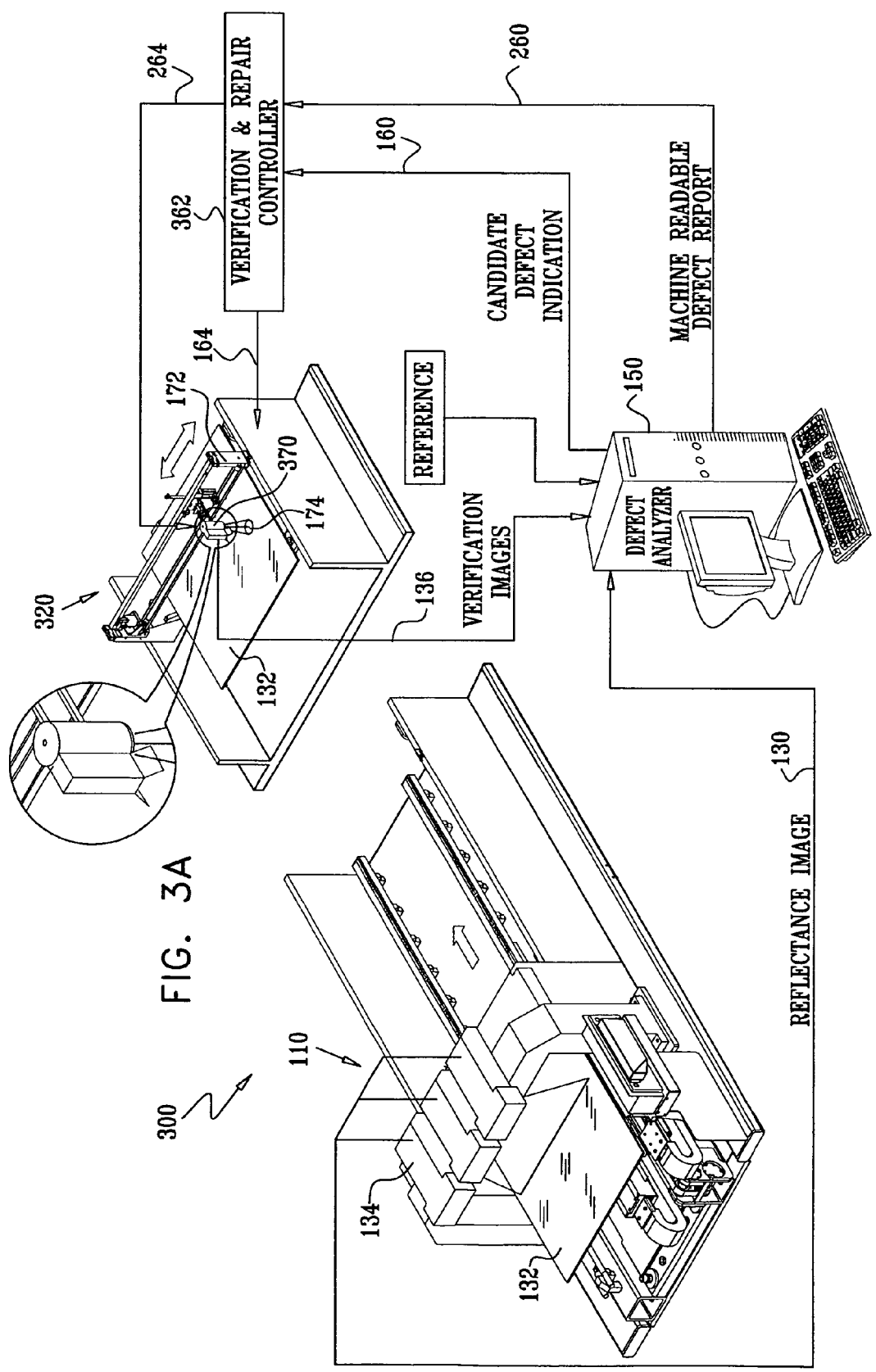
FIG. 3A is a simplified pictorial illustration of apparatus for automatically inspecting and repairing electronic circuits constructed and operative in accordance with another embodiment of the present invention.
Figure 3B:
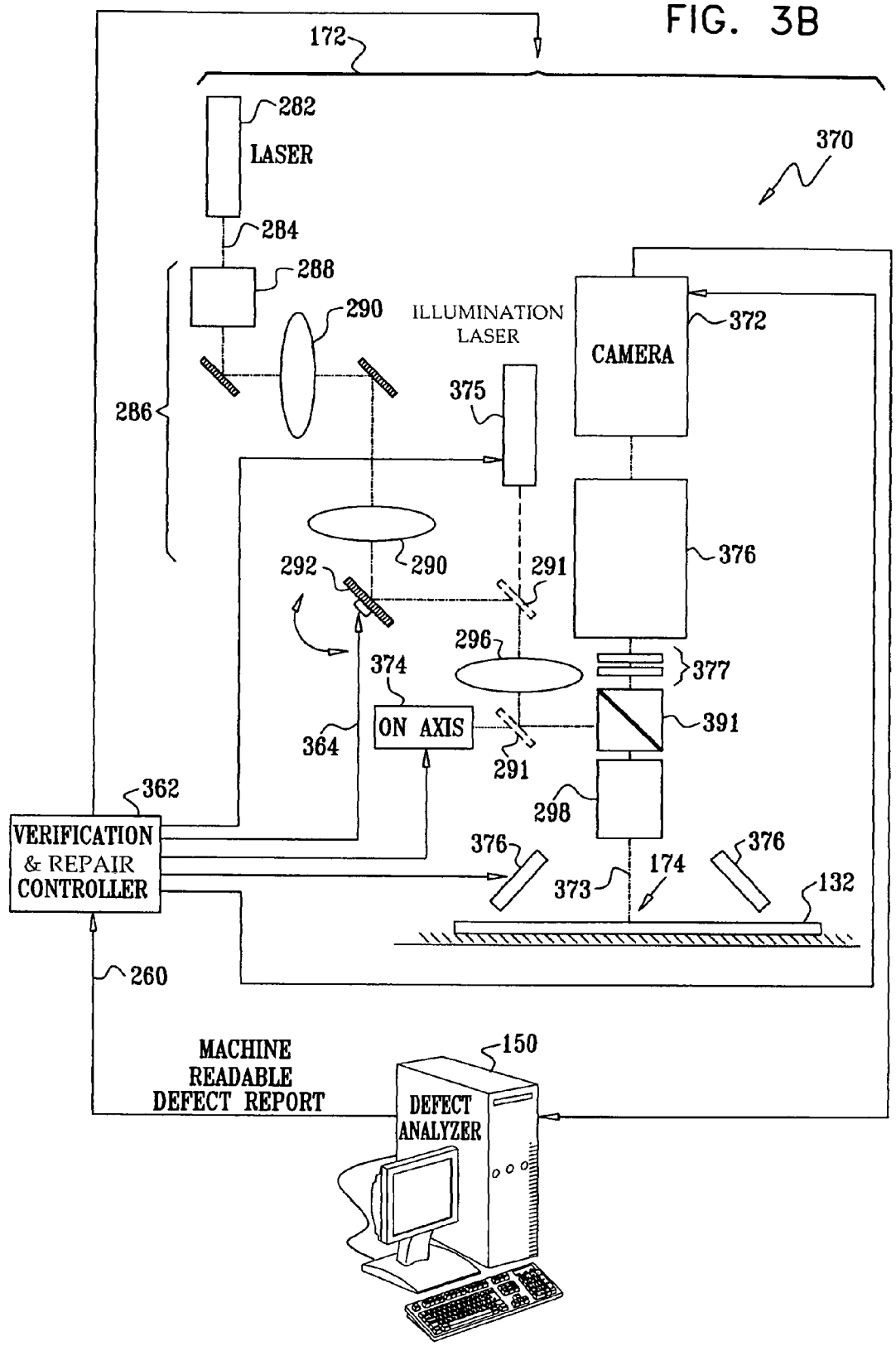
FIG. 3B is a simplified schematic illustration of a portion of the apparatus of FIG. 3A.

Reference is made to FIG. 3A which is a simplified pictorial illustration of apparatus and a functionality for inspecting electronic circuits for defects, and for verifying and repairing the defects, in accordance with an embodiment of the present invention and to FIG. 3B which is a simplified schematic illustration of a portion of the apparatus therein. In accordance with an embodiment of the invention, an electrical circuit inspection and repair system 300 includes a first inspection station 110 for automatically inspecting electrical circuits and a combined automated defect verification and repair station 320 for automatically verifying the correctness of candidate defects found by the first inspection station 110, and then automatically repairing candidate defects which are verified as being actual defects.

Inspection station 110 and its associated components seen in FIG. 3A are configured and operative generally as described with reference to FIG. 1. In order to maintain clarity and avoid obscuring key teaching points of the invention, further description of the structure and functionality of this subsystems has been omitted.

As seen in FIG. 3A, a first electrical circuit 132 is undergoing automated optical inspection at inspection station 110 while a previously inspected electrical circuit 132 is located at defect verification and repair station 320 for defect verification and as needed for the repair of repairable defects. The previously inspected electrical circuit has already been automatically optically inspected at inspection station 110, and at least one candidate defect thereon has been identified by defect analyzer 150.

Indications of candidate defects 160 are supplied to a verification and repair controller 362, which is in operative communication with defect verification and repair station 320. Suitable verification control signals 164 are supplied to defect verification and repair station 320 in order position a verification and repair head 370 and to acquire verification images 136 of candidate defects which are suitable to verify whether the candidate defects identified by defect analyzer 150 as candidate defects are false alarms or actual defects.

Defect verification and repair station 320 includes a positioner 172 operative to sequentially position verification and repair head 370, which includes a camera and a repair device, such as a laser repair device, operative in response to verification control signals 164. Verification images 136 of locations of candidate defects 174 are acquired and analyzed to determine which candidate defects are actual defects and which candidate defects are merely false alarms. As needed, repair operations are performed on those candidate defects determined to be actual defects that are repairable. Verification control signals 164 at least indicate the geometric location of candidate defects as identified by defect analyzer 150. Optionally, other relevant information, such as for example a type of defect, may be additionally indicated. In the embodiment seen in FIG. 3A, positioner 172 is operative to independently control X-Y positioning of verification and repair head 370, although other forms of positioning may be utilized, for example rotational positioning or positioning of electrical circuit 132 relative to verification and repair head 370.

At each candidate defect location 174 on an inspected electrical circuit 132, the location is illuminated with light suitable to provide at least one verification image 136 suitable to be utilized for further automatic defect analysis. In accordance with an embodiment of the invention, as described above with reference to FIG. 1, candidate defect location 174 is illuminated with light at a wavelength that causes a substrate portion thereat to fluoresce, thereby producing a fluorescence image of a portion of electrical circuit 132 in the vicinity of a candidate defect location 174. Optionally, other suitable forms of illumination may be employed for defect verification, for example polychromatic or monochromatic light provided at a various and different angles such as a grazing angle, light having different predetermined spectral compositions or an angled structured light suitable for height analysis. Verification images may be at the same resolution as reflectance images 130 employed for identifying candidate defects, or at a different resolution, for example a higher resolution.

Verification images 136 are provided to defect analyzer 150, which in the embodiment shown is operative to provide an image analysis functionality for both the reflectance image 130 acquired during initial inspection and for verification images 136, although this need not be the case. Optionally, a separate defect analyzer may be employed for analysis of the reflective images 130 and verification images 136 respectively. Separate defect analyzers may be, for example, different CPUs located in different computers, or different CPUs in the same computer, or virtually separated CPUs in the same computer.

Image analysis functionalities for initial inspection and for subsequent automatic defect verification may both utilize at least some image processing algorithms in common or they may utilize different image processing algorithms. Suitable devices and methodologies for automatically optically inspecting electrical circuits and automatically verifying candidate defects as being real defects, or otherwise, are described in detail in U.S. Pat. No. 6,870,611 to Savereigo et al. and U.S. patent application Ser. No. 10/793,224 to Noy et al., published under application number 2005/195389, both of which are assigned to the present Assignee, and the disclosures of which are incorporated herein by reference in their entirety.

Upon acquisition of a verification image 136 at location 174, defect analyzer determines whether a repairable actual defect is present thereat. If a repairable actual defect is present at location 174, defect analyzer 150 supplies a machine readable defect report 260 to a verification and repair controller 362. Machine readable defect report 260 includes at least the location whereat a repair operation is to be performed. As necessary, verification and repair controller 362 processes the machine readable defect report 260 and outputs repair control signals 264. One or more of the defect analyzer 150 and the verification and repair controller 362 defines repair parameters and provides a prescription according to which the defect is to be repaired. Such a prescription may include, for example, one or more of the nature of the repair operation (for example laser ablation of errant conductor), a precise definition of the location to receive laser energy, the quantity of laser pulses to be delivered and laser power to be applied.

It is noted that although verification and repair controller 362 is depicted in FIG. 3A as a single unit, this need not be the case, and separate verification and repair controllers may be provided for each of the respective verification functionality and repair functionality.

Verification and repair head 370, in addition to a camera and image acquisition optics, additionally includes a repair device such as a laser for laser repairing repairable defects on electrical circuit 132. For clarity of explanation of the teaching points of the invention, an embodiment in which a single unit for verification and repair comprising both a camera and a laser is shown, although this need not be the case. Optionally, the camera and laser respectively may each be included in separate, independently positionable, units. Repair operations that may be performed by a verification and repair head 370 include, for example, ablating spurious portions of conductors, processes to locally deposit additional conductor material.

In accordance with an embodiment of the invention, laser energy is delivered to defect location. 174 in accordance with a repair prescription in response to repair control signals 264 to perform a repair operation. Following completion of an initial repair operation, verification and repair head 370 acquires at least one additional verification image 136 of location 174 which is supplied to defect analyzer 150. If defect analyzer 150 determines that a repairable actual defect is still present at defect location 174, a new machine readable defect report 260 is supplied to verification and repair controller 362, a prescription for a subsequent repair operation is automatically reformulated as needed, and the repair device in verification and repair head 380 performs an additional repair operation at defect location 174 in accordance with the reformulated repair prescription. The process of verifying the presence of a defect, reformulating a repair prescription, and subsequent automatically performing a repair operation is repeated until defect analyzer 150 determines that the repairable defect has been suitably repaired, or that defect location 174 is not repairable.

Upon determination that the repairable defect has been suitably repaired, verification and repair head 370 is repositioned at a next candidate defect location, in response to verification control signals 164. One or more verification images 136 are acquired at the next location of a candidate defect, which are then provided to defect analyzer 150. Defect analyzer 150 automatically analyzes the one or more verification images of the next candidate defect location to verify whether an actual defect is present at the next candidate defect location. If a repairable actual defect is present at the next candidate defect location 174, a repair operation with follow up verification and reformulation of the repair operation are performed until the defect is suitably repaired, or it is determined that the defect location 174 is not repairable, as described above.

Reference is now made to FIG. 3B, which is a simplified schematic illustration of a defect verification and repair head 370. In accordance with an embodiment of the invention, verification and repair head 370 includes an image acquisition functionality and a repair functionality such as a laser repair functionality for repairing defective conductors on an electrical circuit 132. The laser repair functionality is suitable for example, for ablating spurious portions of conductor materials, removing oxide formed on a conductor, or otherwise reshaping misshaped conductor portions, and may be used in a process to apply conductive material to locations whereat conductor is missing.

In accordance with an embodiment of the invention, in association with verification and repair head 370, the image acquisition functionality includes a camera 372, such as a 3 chip CCD available from JAI of Denmark imaging location 174 along an optical axis 373, and an illuminator providing one or more of on-axis and off-axis illumination. In the embodiment seen in FIG. 3B, on-axis illumination is provided by a fluorescence illuminator comprising an illumination laser 375 delivering illumination to location 174 at a wavelength suitable to cause the substrate of electrical circuit 132 to fluoresce thereat, and by a high brightness on-axis illuminator 374, such as LED illuminator providing monochromatic or polychromatic illumination. As seen in FIG. 3B, light from illumination laser 375 and from on-axis illuminator 376 passes through suitable beam combiners, such as partially silvered mirrors, so as to illuminate location 174 along optical axis 373. Off-axis illumination is provided by off-axis illuminators 376, which may be LED illuminators providing suitable monochromatic or polychromatic light, arranged as ring illuminators at one or more angles of illumination relative to optical axis 373. Illumination from illumination laser 375, from on-axis illuminator 374 and from off-axis illuminators 376 may be provided simultaneously or at different times as desired in accordance with a particular inspection need.

Camera 372 views location 174 along optical axis 373 through suitable lenses, for example a 6000× zoom tube lens 376 available from Navitar and a 10×/0.28 objective lens 298 available from Mitutoyo. Suitable filters 377, for example suitable combinations of high pass, low pass and/or notch optical filters are provided to ensure that camera 372 only receives imagery as required to perform defect verification, and to filter out light that interferes with obtaining images suitable for defect verification, for example reflectance from the fluorescence illumination provided illuminator laser 375 employed to cause the substrate of electrical circuit 132 to fluoresce.

In accordance with an embodiment of the invention, respective verification and repair functionalities of verification and repair head 370 are arranged to at least partly share the same optical path along optical axis 373. The repair functionality includes a pulsed laser generator 282, such as a passive Q-switch micro laser available from Teem Photonoics of Grenoble, France, supported by a positioner 172, operative to generate a pulsed laser beam 284. A suitable micro laser may be selected, for example, from laser heads operative to output beams at a wavelength of 532 nm or at 1064 nm, depending on the application. Pulsed beam 284 is passed through first focusing optics 286 including for example suitably coated 10× objective lens 288 and 125 mm focusing lenses 290, readily available from optical suppliers such as Edmund Optics and Newport Corporation, both of the United States, operative to focus laser beam 284. Pulsed beam 284 is directed to impinge on a two-axis fast steering mirror (FSM) 292 available from Newport Corporation, arranged to sweep the pulsed beam 284 through desired locations on electrical circuit 132. Subsequently the pulsed laser beam 284 is folded by partially transmissive mirrors 291 arranged to combine the optical paths of laser beam 284 and illumination from illumination laser 375 and on-axis illuminator 374, is passed through second focusing optics 296, including a 62.9 mm lens available from Edmund Optics and objective lens 298. In accordance with a preferred embodiment of the invention, the lenses and optical components are arranged as shown and are suitably coated for operation in conjunction with the selected wavelength of laser beam 284.

As noted above, in accordance with an embodiment of the invention, the respective verification and repair functionalities of head 370 at least partly share an optical path. A polarizing cubic beam splitter 391 combines the respective paths of beam 384, illumination from illumination laser 375 and on-axis illuminator 374, to coincide with optical axis 373 along which camera 372 views electrical circuit 132 at location 174.

Verification and repair controller 362 is provided to be in operative communication with defect verification and repair head 370, including with camera 372, on-axis illuminator 374, illumination laser 375, and off-axis illuminators 376, suitably position laser defect verification and repair head 370 relative to a defect location 174 on electrical circuit 132 to be repaired, to provide a desirable illuminator for a defect verification operation, and to acquire an image of defect location 174. Additionally, verification and repair controller 362 suitably communicates with positioner 172, laser 282 and with FSM 292 to control and steer beam 284 as required to perform a laser repair operation, such as ablation of spurious conductor deposits.

In an embodiment of the invention, verification and repair controller 362 is in communication with positioner 272, suitably an X-Y positioner, to suitably position verification and repair head 370 relative to a candidate defect location 174. Optionally, defect verification and repair head 370 is stationary, and the positioner is operative to suitably move electrical circuit 132 relative to the defect verification and repair head 370.

The positional orientation of steering mirror 292 is controlled by repair control signals 364 supplied by defect verification and repair controller 362 in response to a machine readable defect report 260 received from defect analyzer 150. Manipulation of steering mirror 292 directs beam 284 to selectively impinge on desired locations on electrical circuit 132 as required for repair.

Figure 4:
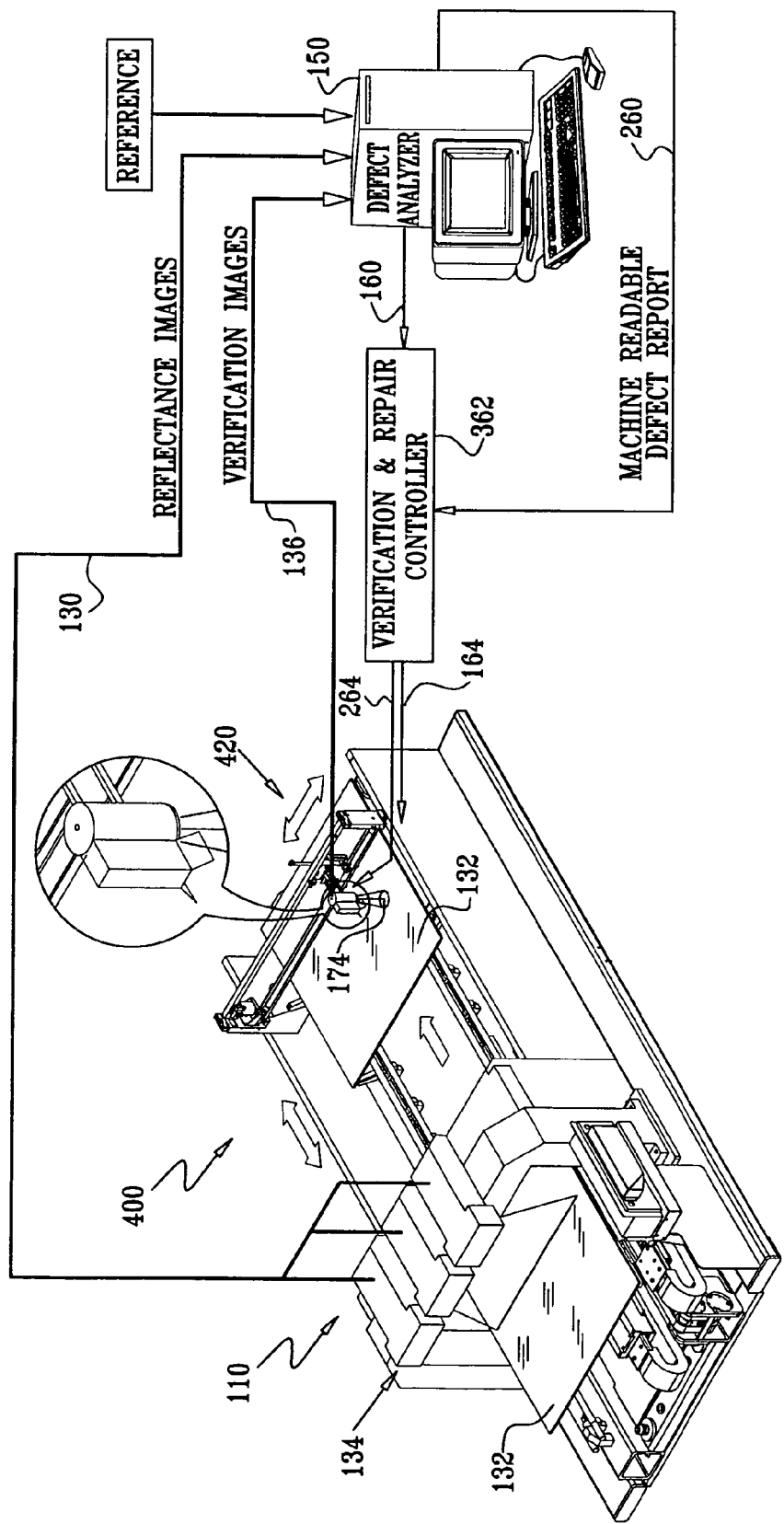
FIG. 4 is a simplified pictorial illustration of apparatus for automatically inspecting and repairing electronic circuits constructed and operative in accordance with another embodiment of the present invention.

Reference is now made to FIG. 4, which is a simplified schematic illustration of an apparatus and a functionality for inspecting electrical circuits for defects, and for verifying and repairing the defects, in accordance with another embodiment of the invention. In accordance with an embodiment of the invention, an electrical circuit inspection and repair system 400 includes a first inspection station 110 for automatically inspecting electrical circuits and a combined automated defect verification and repair station 420 for automatically verifying the correctness of candidate defects found by the first inspection station 110, and then automatically repairing candidate defects which are verified as being actual defects. In accordance with an embodiment of the invention, as seen in FIG. 4, inspection station 110 and automated defect verification and repair station 420 are integrally formed on the same chassis as part of a unit comprising inspection and repair system 400.

Inspection station 110 and its associated components seen in FIG. 4 are configured and operative generally as described with reference to FIG. 1. The automated defect verification and repair station 420 and its associate components seen in FIG. 4 are configured and operative generally as described with reference to FIGS. 3A and 3B. In order to maintain clarity and avoid obscuring key teaching points of the invention, further description of the structure and functionality of these subsystems has been omitted.

Figure 5:
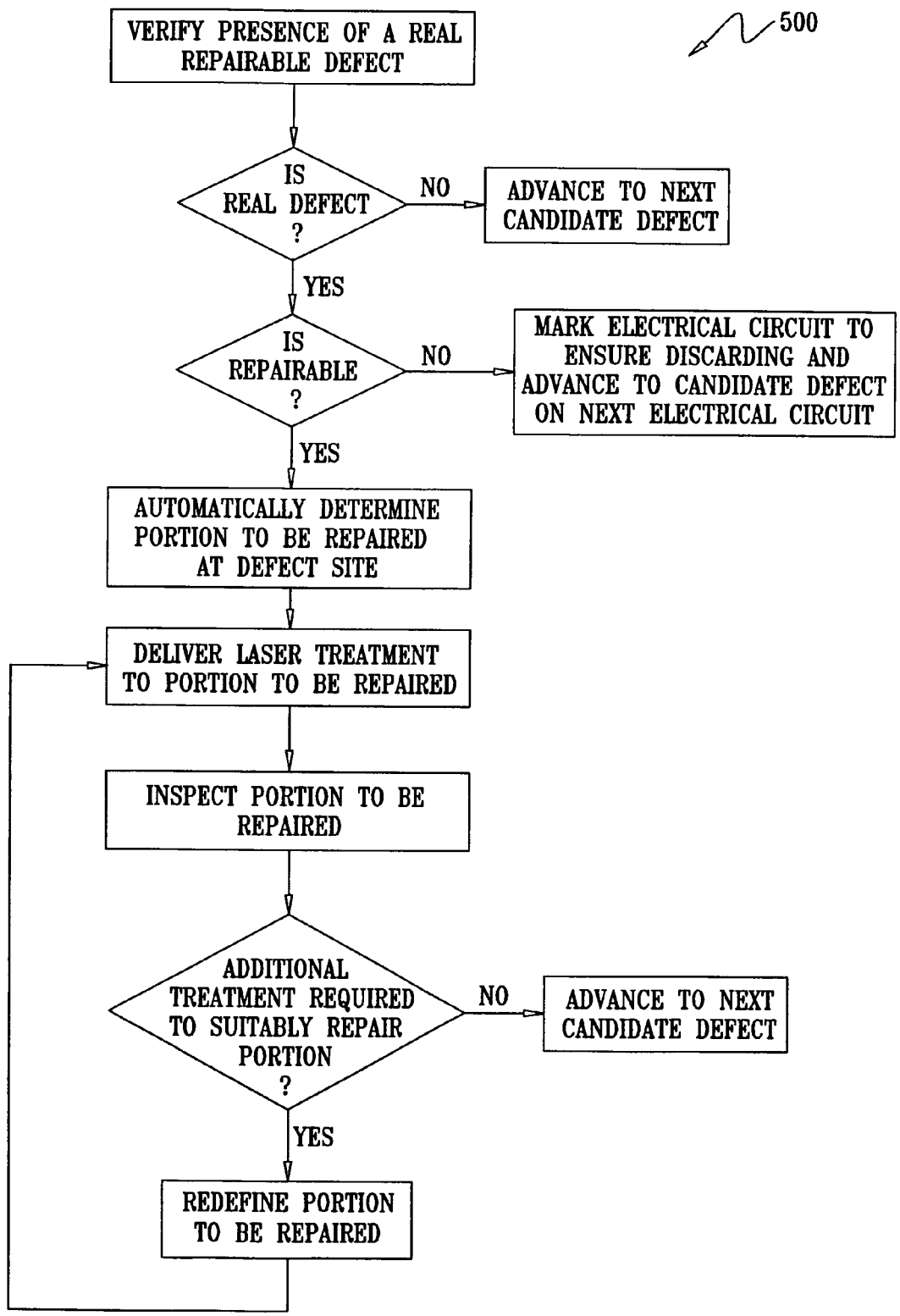
FIG. 5 is a simplified flow diagram illustrating an automated mode of operation of verification and repair apparatus in FIGS. 2A-4, in accordance with an embodiment of the invention.

Reference is now made to FIG. 5 which is a simplified flow diagram 500 illustrating an automated mode of operation of verification and repair apparatus in FIGS. 2A-4, in accordance with an embodiment of the invention and to FIGS. 6A-11 which are simplified illustrations showing repair of electrical circuit conductors in accordance with the process seen in FIG. 5.

In accordance with an embodiment of the invention, an electrical circuit is initially inspected to identify candidate defect locations. Initial inspection may be conducted using stand-alone inspection apparatus (FIGS. 1 and 3A), using inspection apparatus that is combined with a functionality to verify candidate defects as being real defects (FIG. 2A), or using inspection apparatus that is combined with both verification and repair functionalities (FIG. 4).

As seen in diagram 500, the presence of a real and repairable defect at a candidate defect location is verified, for example using defect analyzer 150. FIG. 6A shows a portion of an electrical circuit, verified as being defective and repairable. The electrical circuit portion includes conductor lines 610 and 620. The conductor lines are short circuited by an extraneous conductor segment 630. The defect seen in FIG. 6A has been determined to be repairable by removal of the extraneous conductor segment 630. If a candidate defect location is determined to be a non-defect, then a verification operation proceeds at a next candidate defect location. If a candidate defect location is determined to be a defect that is not repairable, the electrical circuit may be discarded or suitably marked, for example using laser 282 (FIGS. 2B and 3B) to ensure that the defective electrical circuit ultimately is discarded. Verification may be entirely automated, or optionally may be subject to the approval by a human operator.

However, should a real and repairable defect be determined to be present at a candidate defect location, then the portion of the electrical circuit to be repaired at the defect site or location is defined, and a repair treatment is prescribed. FIG. 6B shows a 2-dimensional image of the electrical circuit portion depicted in FIG. 6A, and FIG. 6C shows a reference image 152 comprising contours that corresponds to a properly formed electrical circuit portion seen in FIG. 6A. Analysis of the image of FIG. 6B in relation to the reference seen in FIG. 6C verifies that the electrical circuit portion is indeed defective and that segment 640 needs to be removed in order to repair the electrical circuit.

In the present example, a segment to be repaired 640, seen in FIG. 6D, is defined and a suitable repair treatment is formulated to repair segment 640, for example removal of appropriate portions of extraneous conductor segment 630 by laser ablation. A prescription for laser treatment may be formulated by defect analyzer 150, or by a co-processor such as at repair controller 262 (FIG. 2A) or at a verification and repair controller 362 (FIG. 3A or FIG. 4), or by other suitable processing means. In accordance with an embodiment of the invention, laser treatment to remove an excess conductor segment, such as extraneous conductor segment 630, typically will be formulated to at least partially remove the segment while avoiding damaging the substrate upon which the electrical circuit is formed. This may mean providing a laser dosage that would leave part of an extraneous conductor portion not removed. That is to say, the laser used, or the power of laser beam output by the laser, will be chosen to so that it does not damage the substrate—even if this means not fully removing and/or completing a repair operation upon the initial application of laser beam energy to a defective electrical circuit portion. If repair of an electrical circuit portion entails deposition of missing conductive material, a repair treatment may be prescribed to avoid depositing excess conductive material. Consequently, the repair of segment 630 may, or may not be, fully completed following initial treatment.

Laser treatment is subsequently delivered to the portion to be repaired in accordance with the prescribed repair treatment. Following administration of the repair treatment the portion to be repaired is inspected after treatment, for example using an automated verification functionality. An inspection operation is particularly desirable when a laser beam energy dosage is selected to avoid damaging the substrate, even if a repair operation may not be completed upon the initial application of laser treatment. Optionally, the inspection operation both assesses completion of a repair operation performed on a conductor, as well as whether the substrate has been damaged by the laser beam. In accordance with an embodiment of the invention, the automated verification functionality is provided in conjunction with a laser treatment functionality as seen in FIGS. 3A, 3B and 4 to avoid the necessity of passing an electrical circuit to be repaired between separate verification and repair stations.

Should the verification functionality determine that additional treatment is required in order to suitably repair the electrical circuit, the portion to be treated in order to effect repair is redefined and a new treatment prescription, including the quantity of laser energy to be applied (where a laser having an adjustable laser power output is employed) is formulated. Repair treatment, for example laser treatment, is repeated according to the reformulated prescription. The inspection, decision and treatment reformulation operations are repeated until determination has been made that the portion to be repaired has been suitably repaired. Upon such determination that a suitable repair has been effected, the system advances to verify the presence of a real and repairable defect at the next candidate defect location.

FIG. 7A shows conductors 610 and 620 and extraneous segment 630 after an initial application of a laser repair treatment. The initial laser repair treatment was insufficient to entirely remove segment 630. Consequently, as seen in FIG. 7B, a 2 dimensional verification image, acquired for example by fluorescence imagery, indicates that segment 630 has not been entirely removed, and as seen in FIG. 7C, a prescription for laser repair treatment is formulated for all of region 640 corresponding to extraneous conductor segment 630. Other forms of verification imagery may be employed, for example 3-D imagery, which would be suitable for making a determination of the height of conductor remaining. Such determination may be helpful in defining a subsequent laser treatment prescription, for example defining the laser power to be applied during subsequent laser treatment.

Upon further administration of laser treatment in accordance with the reformulated repair prescription, segment 630 is further eroded and the remaining portions 632 and 634 of extraneous conductor segment 630 are non-contiguous as seen in FIG. 8A. As seen in FIG. 8B, a 2-dimensional verification image, acquired after administration of a laser repair treatment, indicates that extraneous conductor segment 630 has been only partially removed when analyzed in relation to the reference image seen in FIG. 6C. As seen in FIG. 8C, a prescription for laser repair treatment is reformulated so that laser energy is delivered only to prescribed region 640, which corresponds to the remaining portions 632 and 634 of extraneous conductor segment 630. It is noted that, as the segment becomes further eroded by the application of ablating laser energy, the intensity of the treatment may be reduced in order to avoid unnecessary damage to the substrate.

Figure 10:
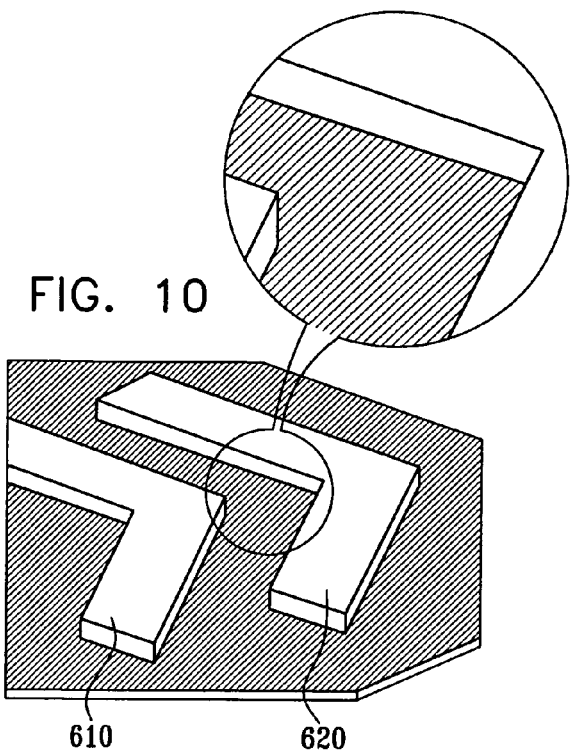
Figure 11:
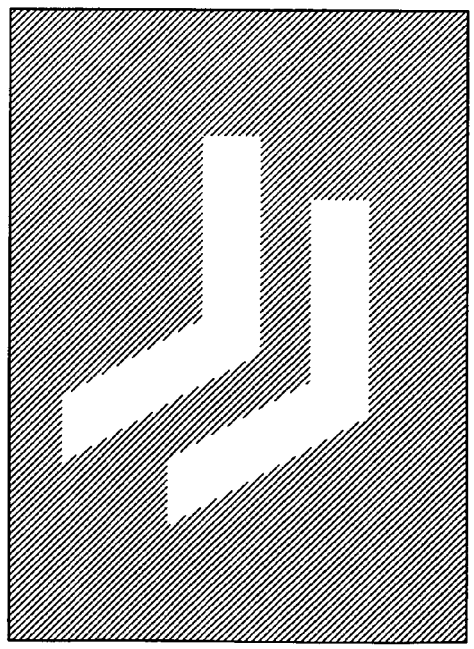

Upon still further administration of laser treatment in accordance with the reformulated repair prescription, the remaining portions 632 and 634 of extraneous conductor segment 630 are still further eroded as seen in FIG. 9A. As seen in FIG. 9B, a 2-dimensional verification image acquired after administration of a laser repair treatment, when analyzed with respect to a reference image as seen in FIG. 6C, indicates that portions 632 and 634 of extraneous conductor segment 630 still remain. As seen in FIG. 9C, a prescription for laser repair treatment is reformulated to only remove the remaining portions of region 640, which correspond to the still remaining portions 632 and 634 of extraneous conductor segment 630 thereby resulting in the repair of conductors 610 and 620 as seen in FIG. 10. The suitable repair of conductors 610 and 620 is verified from a 2-dimensional verification image as seen in FIG. 11 that is analyzed in relation to a reference as seen in FIG. 6C.

It is noted that the quantity of iterative treatment steps required to repair a conductor varies, and may be a function, inter alia, of the size of the defect to be repaired, the power of the laser, and the sensitivity of the substrate to laser damage.

It will be appreciated by persons skilled in the art that the present invention is not limited to what has been particularly shown and described hereinabove. For example, various embodiments of the invention may include different combinations of sensors and control devices. The scope of the present invention includes both combinations and subcombinations of the various features described herein as well as modifications and variations thereof which would naturally occur to a person skilled in the art upon reading the foregoing description and which are not in the prior art.

There is claimed:

1. An apparatus, intended for use in automatically inspecting and repairing electrical circuits, comprising:
    an inspection means for executing an automatic inspection of electrical circuits and providing a machine readable indication of one or more regions thereon requiring repair;
    an automatic repair means for employing said machine readable indication to execute an automatic repair operation of said electrical circuits at said one or more regions thereon requiring repair; and
    an automatic verification means for executing an automatic reinspection of said one or more regions based on said machine readable indication of said one or more regions thereon requiring repair, following said automatic repair operation, and providing to said automatic repair means a reformulated machine readable indication of whether said one or more regions require additional repair, are adequately repaired, or are irreparable;
    wherein said automatic repair means employs a sweeping laser assembly for ablating spurious conductor deposits within said one or more regions, said sweeping laser assembly comprising a fast-steerable mirror which is steerable about at least two axes.

2. The apparatus according to claim 1, wherein said sweeping laser assembly comprises a laser arranged to output a laser beam impinging on said fast steerable mirror.

3. The apparatus according to claim 1, wherein said sweeping laser assembly further comprises a laser.

4. The apparatus according to claim 1, wherein said sweeping laser assembly further comprises a laser configured to output a laser beam having an intensity to remove less than all of a thickness of an extraneous conductor and to avoid damaging a substrate portion associated with said electrical circuits.

5. The apparatus according to claim 1, wherein said automatic verification means and said automatic repair means both employ at least one common verification and repair optical element.

6. The apparatus according to claim 1, wherein said inspection means includes a candidate defect identification operation and a defect verification operation.

7. The apparatus according to claim 1, wherein said automatic repair means is operative to perform one or more additional repair operations in response to a reformulated machine readable indication of at least one region requiring additional repair.

8. The apparatus according to claim 1, wherein said electrical circuits are printed circuit boards.

9. A method, for automatically inspecting and repairing electrical circuits, comprising:
- automatically executing an inspection of electrical circuits and providing a machine readable indication of one or more regions thereon requiring repair;
- performing a repair operation on said electrical circuits, using a sweeping laser assembly, in response to said machine readable indication, at said one or more regions thereon requiring repair;
- reinspecting said one or more regions, based on said machine readable indication of said one or more regions thereon requiring repair, following said repair operation to provide an additional machine readable indication of whether said one or more regions require additional repair, are adequately repaired, or are irreparable; and
- performing an additional repair operation, using said sweeping laser assembly, in response to said additional machine readable indication of at least one region requiring additional repair;
- wherein said sweeping laser assembly comprises a fast-steerable mirror which is steerable about at least two axes to ablate spurious conductor deposits within said one or more regions requiring a repair and said at least one region requiring additional repair.

10. The method according to claim 9, wherein said performing a repair operation and said reinspecting said one or more regions both employ at least one common optical element for both inspection and repair.

11. The method according to claim 9, wherein said sweeping a laser beam comprises outputting a laser beam, and directing said laser beam to impinge on said fast steerable mirror.

12. The method according to claim 11, wherein said outputted laser beam has an intensity to remove less than all of a thickness of an extraneous conductor without damaging a substrate portion associated with said electrical circuits.

13. The method according to claim 9, wherein said automatically inspecting includes identifying candidate defects, and then verifying candidate defects as real and repairable defects.

14. The method according to claim 9, wherein said electrical circuits are printed circuit boards.

15. The method according to claim 9, further comprising acquiring at least one further verification image and repeating said performing additional repair until said additional machine readable indication indicates that said one or more regions are adequately repaired or are irreparable.

* * * * *